United States Patent
Kakiuchi

[11] Patent Number: 5,204,285
[45] Date of Patent: Apr. 20, 1993

[54] METHOD FOR PATTERNING A METAL LAYER

[75] Inventor: Takao Kakiuchi, Takarazuka, Japan

[73] Assignee: Matsushita Electronics Corporation, Osaka, Japan

[21] Appl. No.: 855,459

[22] Filed: Mar. 19, 1992

Related U.S. Application Data

[63] Continuation of Ser. No. 616,865, Nov. 21, 1990, abandoned.

[30] Foreign Application Priority Data

Dec. 1, 1989 [JP] Japan .................. 1-313626

[51] Int. Cl.$^5$ .......................... H01L 21/302
[52] U.S. Cl. .................... 437/187; 437/194; 437/197; 437/962; 156/659.1; 156/664; 156/665
[58] Field of Search .......... 437/187, 194, 197, 962; 148/DIG. 51; 156/664, 665, 659.1

[56] References Cited

U.S. PATENT DOCUMENTS

| 4,668,335 | 5/1987 | Mockler et al. | 156/643 |
| 4,925,524 | 5/1990 | Beatty | 156/643 |
| 4,954,423 | 9/1990 | McMann et al. | 430/316 |
| 5,017,513 | 5/1991 | Takeuchi | 437/228 |
| 5,045,150 | 9/1991 | Cleeves et al. | 156/643 |
| 5,134,093 | 7/1992 | Onishi et al. | 437/197 |

FOREIGN PATENT DOCUMENTS

| 54-116882 | 11/1979 | Japan | 437/187 |
| 59-189657 | 10/1984 | Japan | 437/194 |
| 62-221118 | 9/1987 | Japan | 437/197 |
| 1-298740 | 1/1989 | Japan | 437/194 |

OTHER PUBLICATIONS

Twenty Five nm Features Patterned With Trilevel E-Beam Resist, D. M. Tennant et al. J. Vacuum Society Technology 19(4), Nov./Dec. 1981, pp. 2-5.
VLSI Engineering, Thomas E. Dillinger, Prentice Hall, pp. 814-817, 1988.
Integrated Circuit Fabrication Technology, David J. Elliott, McGraw-Hill Publishing Co., pp. 98-101, 1989.

Primary Examiner—Olik Chaudhuri
Assistant Examiner—Ken Horton
Attorney, Agent, or Firm—Ratner & Prestia

[57] ABSTRACT

A method for patterning a metal layer without so-called "rabbit ears" comprising the steps of:

deposition of a metal layer on a substrate, deposition of a barrier layer on the metal layer, formation of a mask layer of a predetermined pattern on the barrier layer, etching of the barrier layer and the metal layer under conditions such that the mask layer is also eroded slightly, and removal of the mask layer. In other embodiments, selective etching of barrier layer and mask sidewalls avoids or eliminates such "rabbit ears" and/or etchant product deposits which are precursors of such "rabbit ears".

2 Claims, 10 Drawing Sheets

METHOD FOR PATTERNING A METAL LAYER

This application is a continuation of application Ser. No. 07/616,865 filed Nov. 21, 1990, now abandoned.

BACKGROUND OF THE INVENTION

The present invention relates to a method for patterning a metal layer by dry etching for use, in particular, in a process for fabricating a semiconductor device.

FIGS. 22-29 are cross-sectional views illustrating a conventional process to make a pattern of a metal layer.

Figure 22:
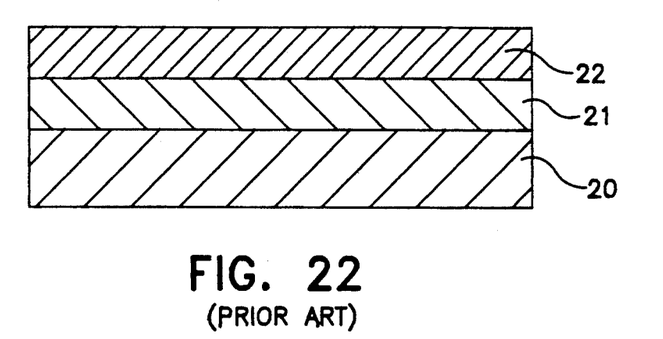
FIGS. 22 through 29 are cross-sectional views illustrating a typical conventional process.

The process comprising:

(1) Forming a 1.0 μm-thick $SiO_2$ (silicon dioxide) layer 21 and a 1.0 μ-thick AlSi (Alluminum alloy including silicon) layer 22 on a Si (silicon) substrate 20. [FIG. 22]

Figure 23:
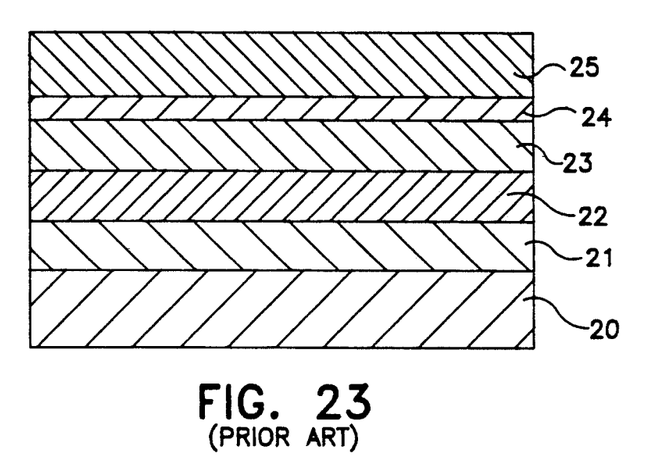
Figure 24:
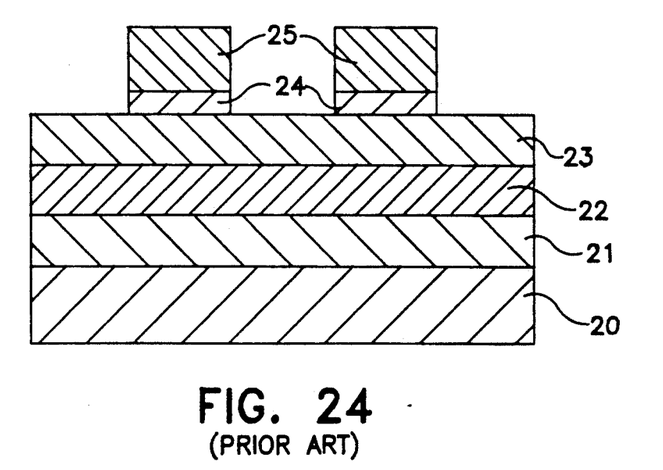

(2) Depositing a 3-layer resist consisting of a first resist layer as the lower layer 23, SOG (Spin-on-glass) as the middle layer 24, and a second resist layer as the upper layer 25 on the AlSi layer 22. [FIG. 23]

(3) Patterning the upper layer 25 using conventional photographic technology, and etching the middle layer 24. [FIG. 23].

(4) Removing the upper layer 25 and etching the lower layer 23 using the middle layer 24 as an etching mask. An inevitable problem in this process is the deposition of products 40 which result from a reaction between the etchant and the surface of the AlSi layer 22. [FIG. 25]

Figure 25:
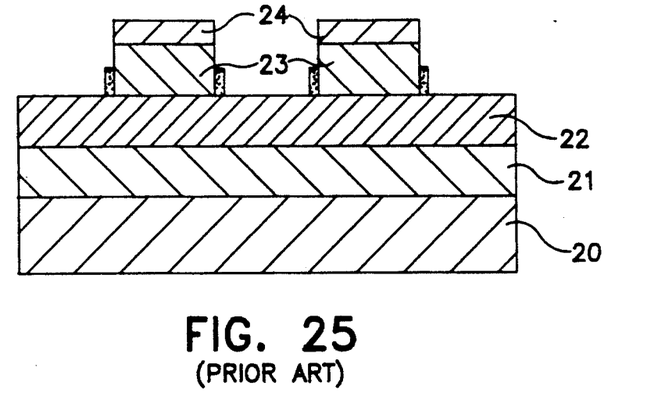
Figure 26:
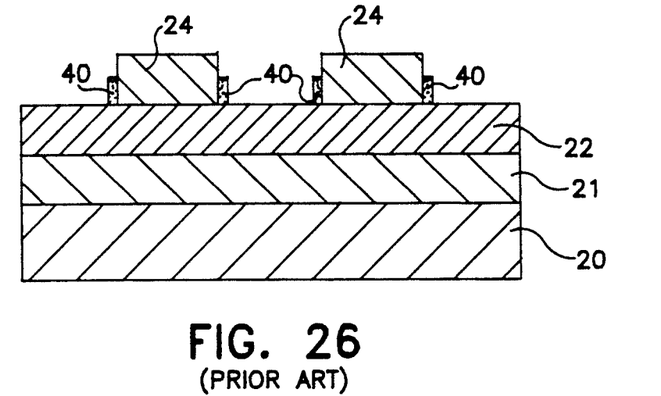

(5) Removing the middle layer 24. [FIG. 25]

(6) Etching the AlSi layer 22 using the lower layer 23 as a mask.

Figure 27:
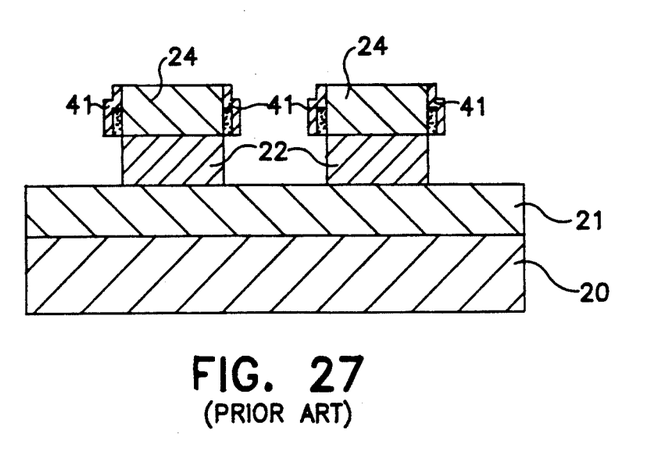

Inevitably, a portion of the etching products 41 is deposited on the wide wall layer 23. [FIG. 27]

Figure 28:
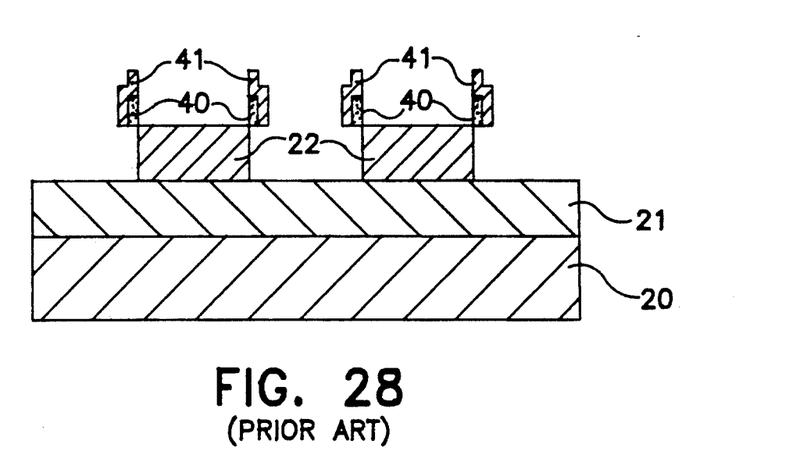

(7) Removing the lower layer 23, leaving so-called "rabbit ears" at the shoulders of the patterned AlSi 22. [FIG. 28]

Figure 29:
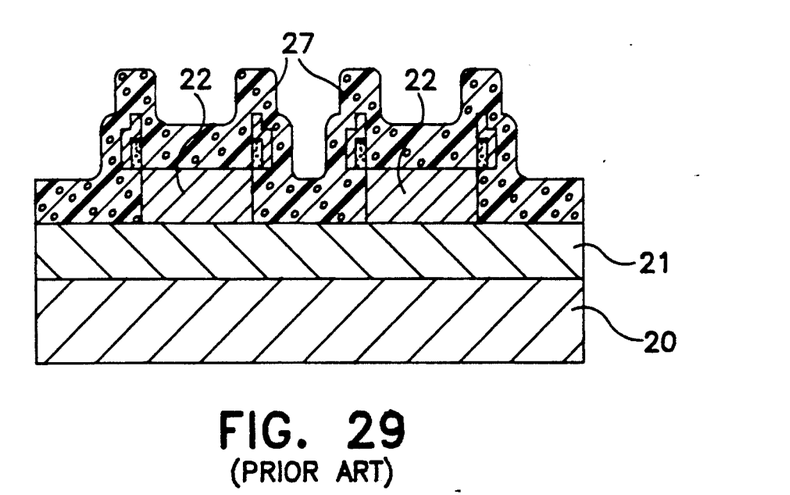

(8) Depositing a final passivation layer 27. [FIG. 29]

In a conventional dry etching metal patterning process as described above, "rabbit ears" on the shoulder of the patterned metal layer causes deterioration of the coverage of the passivation layer thereon. Specifically, the passivation layer tends to develop cracks and/or pinholes. Accordingly, semiconductor devices fabricated in this conventional process may suffer from poor reliability.

SUMMARY OF THE INVENTION

Therefore, the prime object of the present invention is to provide a method for making a fine metal pattern by dry etching without formation of "rabbit-ears".

This is accomplished according to the present invention by an improved method for patterning a metal layer comprising the steps of depositing a metal layer on a substrate, depositing a barrier layer on the metal layer, forming a mask layer of a predetermined pattern on the barrier layer, and etching the barrier layer and the metal layer.

According to the present invention, etching conditions are selected so that "rabbit ears" are not formed.

According to one aspect of the present invention, after etching the metal layer, deposited etching product (the precursor of "rabbit ears") is removed before deposition of the next layer thereon.

According to another aspect of the present invention, deposition of etching product is limited to the side wall of the barrier layer so that the deposit does not cause deterioration of the coverage of the passivation layer thereon.

BRIEF DESCRIPTION OF THE FIGURES

The above and other objects and features of the invention will become apparent from the following description considered in conjunction with the accompanying drawings; wherein.

DESCRIPTION OF THE PREFERRED EMBODIMENTS

FIGS. 1 through 8 are schematic sectional views illustrating successive steps of the process of the first embodiment of the present invention.

The process flow is as follows.

(1) Formation of an $SiO_2$ layer 11 (1.0 μm thick, for example) and an AlSi layer or film 12 (0.8 μm thick, for example) on a silicon substrate 10. $SiO_2$ layer 11 is grown thermally and AlSi film 12 is formed by sputtering or vapor deposition. [FIG. 1]

(2) Deposition of a barrier layer 13 (0.1 μm-thick TiN (titanium nitride, for example)) on AlSi layer 12. The TiN layer 13 is deposited by sputtering. [FIG. 2]

(3) Formation of a conventional three-layer resist on TiN layer 13. The three-layer resist consists of a lower resist layer 14, SOG film as a middle layer 15, and an upper resist layer 16. [FIG. 3]

Figure 1:
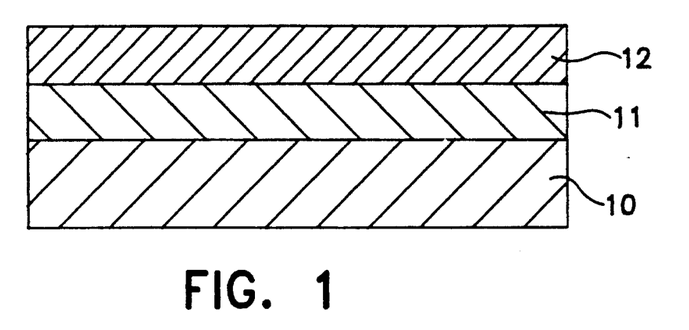
FIGS. 1 through 21 are cross-sectional views illustrating a process for patterning a metal layer in accordance with the present invention.
Figure 2:
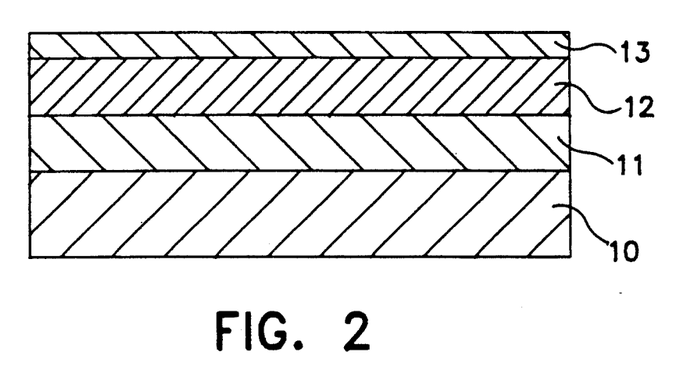
Figure 3:
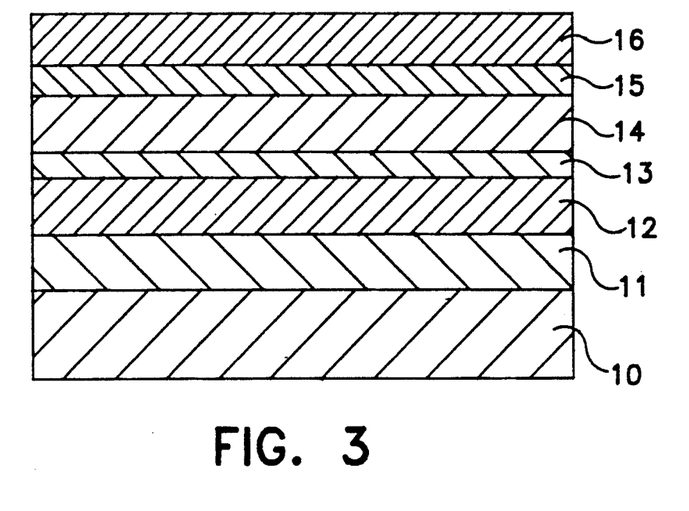
Figure 4:
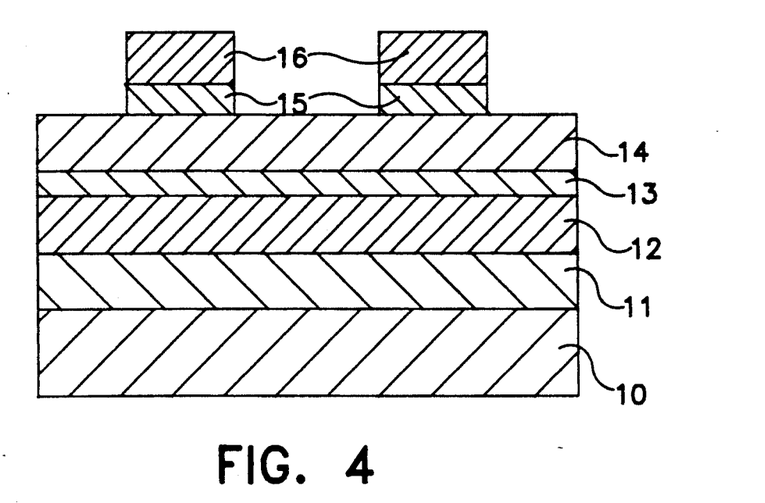
Figure 5:
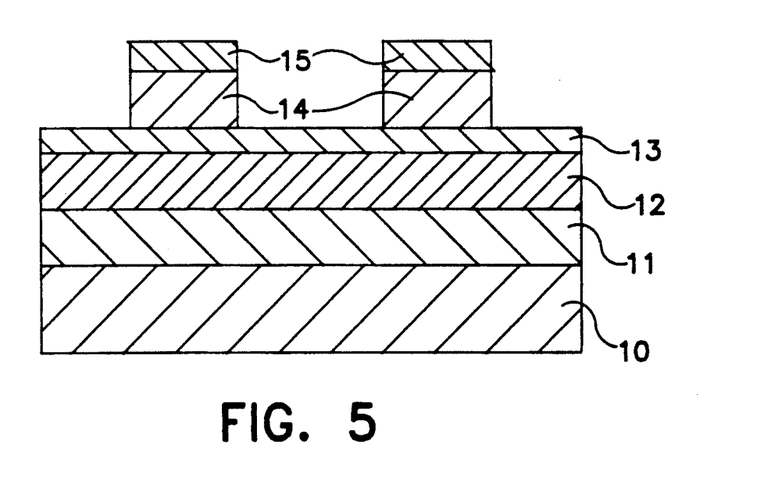

(4) Patterning of the upper resist layer 16 and etching of the middle layer 15. [FIG. 4]

(5) Etching of the lower resist layer 14 using the middle layer 15 as an etching mask. In this step, the upper resist layer 16 is etched off. This etching is performed by oxygen plasma. During this etching step, AlSi layer 12 is covered by TiN layer 13, and is not exposed to the oxygen plasma. Accordingly, no product of reaction between the oxygen and AlSi is formed. Therefore, no deposition takes place on the side wall of the lower resist layer 14. [FIG. 5]

Figure 6:
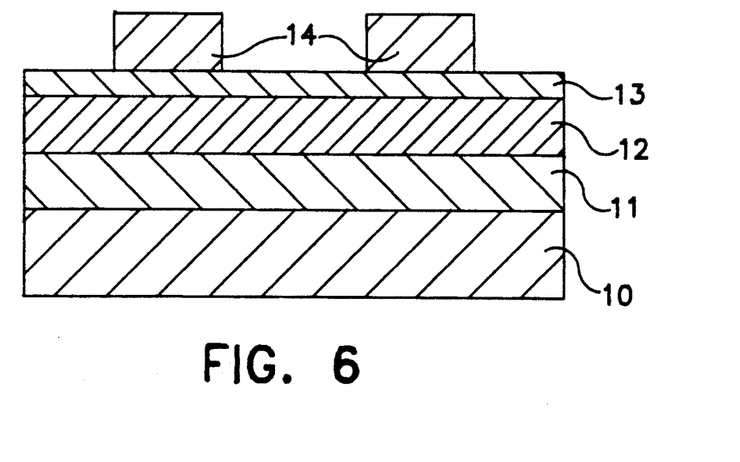

(6) Removing the middle layer 15. [FIG. 6]

(7) Etching of the TiN layer 13 and the AlSi layer 12 using the lower resist layer 14 as a mask. One preferred etching gas for this step is a mixture of a chlorine-containing gas and a fluorine-containing gas such as $BCl_3$ and $CF_4$.

Figure 7:
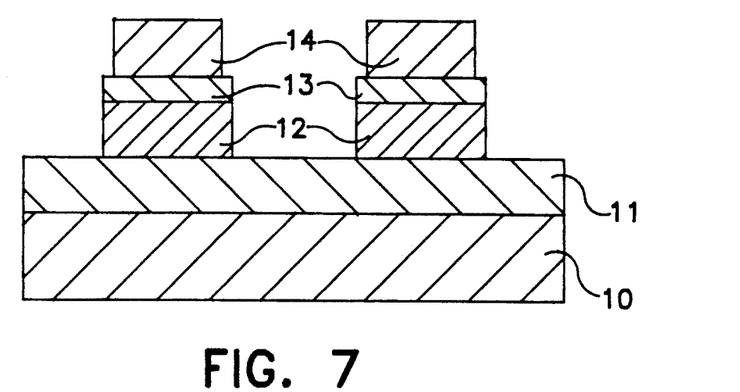

During this etching process, the lower resist layer 14 is slightly eroded at its etched sidewall, making it unlikely that etching product will deposit on the side wall of the lower resist layer 14. [FIG. 7]

Figure 8:
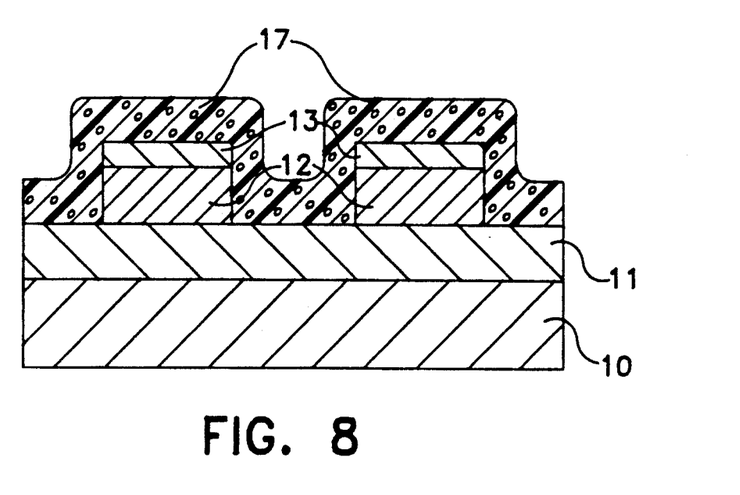
Figure 9:
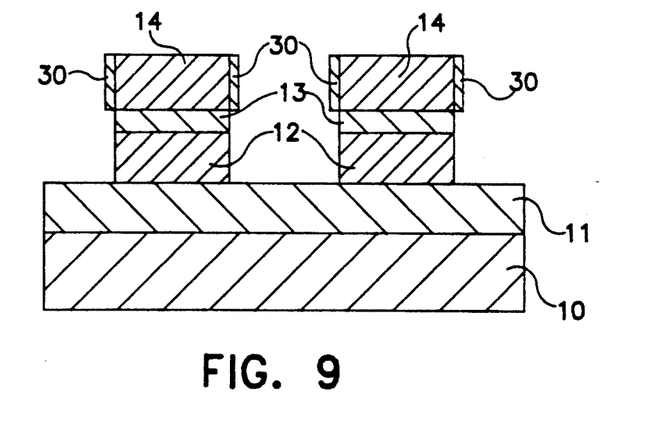
Figure 10:
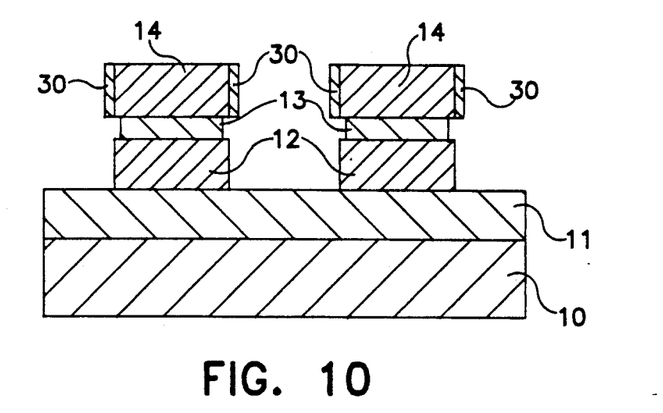

(8) Deposition of a final passivation layer 17, such as an 0.8 μm-thick silicon nitride film formed by plasma-CVD, after the lower resist layer 14 is removed. [FIG. 8]

Because of the absence of "rabbit ears" on the shoulder of TiN layer 13, the patterned AlSi layer 12 is covered comfortably by passivation layer 17, which, as a result, remains defect-free.

Alternatively, TiN layer 13 may be removed before the deposition of the passivation layer.

Next, referring to FIGS. 1-6 and FIGS. 9-11, a second embodiment of the present invention is described. This second embodiment is identical to the first until after removal of the middle layer 15 (FIGS. 1-6). The remainder of the second embodiment then comprises:

(1) Etching of TiN layer 13 and AlSi layer 12 using lower resist layer 14 as an etching mask. The mixture of chlorine-containing gas and fluorine-containing gas, such as BCl3 and CF4, is suitable for this etching. The side wall of the lower resist layer 14 is covered by the thin film of etching product 30. [FIG. 9]

(2) Selective etching of TiN layer 13 in a gas including CHF3 or CF4 or other carbon fluoride. In this environment, TiN layer 13 is eroded at its etching sidewalls so that the top width of the TiN layer 13, in its unetched area, is narrower than the bottom width of the corresponding part of the mask of lower resist layer 14. In this way, thin film deposited 30 is separated from the shoulder of TiN layer 13 [FIG. 10]

Figure 11:
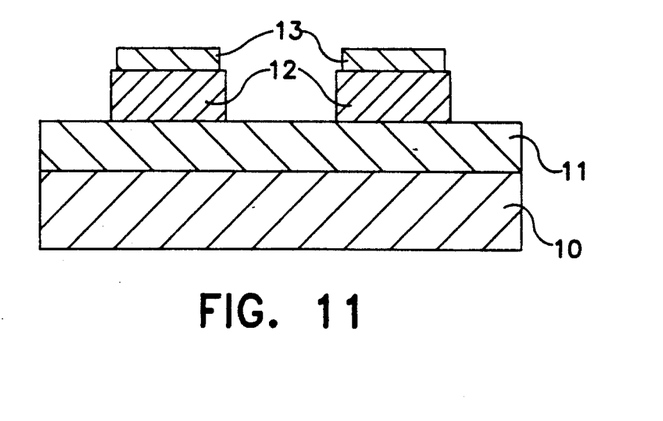
Figure 12:
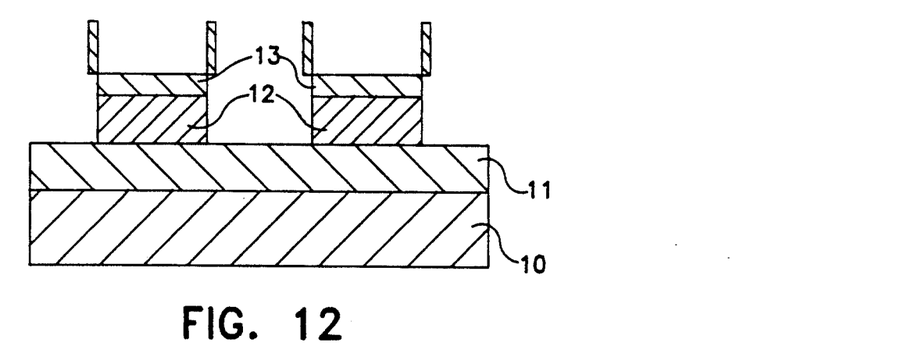

(3) Removing lower resist layer 14, the thin film deposit 30 on the etched side wall of layer 14 is also removed. [FIG. 11]

Deposition of the final passivation layer follows in a conventional manner.

In this embodiment, thin film deposit 30 once formed on the etched side wall of the lower resist layer 12 is removed with the same layer and no "rabbit ears" appear on the should of TiN layer 13. Accordingly, the final passivation layer can be deposited on the patterned layer with excellent coverage.

FIGS. 1-6 and 9, 12, and 13 are cross-sectional views illustrating the process steps of the third embodiment of this invention. The steps illustrated in FIGS. 1-6 and 9 are identical to those of the second embodiment. The characteristic steps of this third embodiment are as follows:

(1) After etching TiN layer 13 and AlSi layer 12, removing lower resist layer 14. The remaining side wall thin film deposit 30 causes formation of "rabbit ears" on the shoulder of TiN layer 13. [FIG. 12]

(2) Etching TiN layer 13 using a gas including carbon fluoride such as CHF3, CF4. This causes the "rabbit ears" to be lifted off when the shoulder part of the TiN layer 13 is etched. [FIG. 13]

Figure 13:
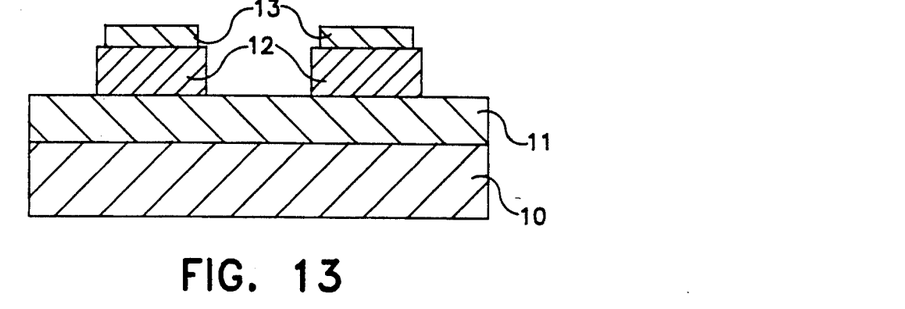

In this process again, no "rabbit ears" appear on the shoulder of TiN layer 13. Accordingly, the final passivation layer can be deposited on the patterned layer with excellent coverage.

The process steps of the fourth embodiment of the present invention is illustrated in FIGS. 1-6, 14-16.

The process, in this embodiment, down to the removal of the middle layer 15 (FIGS. 1-6) is identical to the first embodiment. This is followed by the additional steps described.

Figure 14:
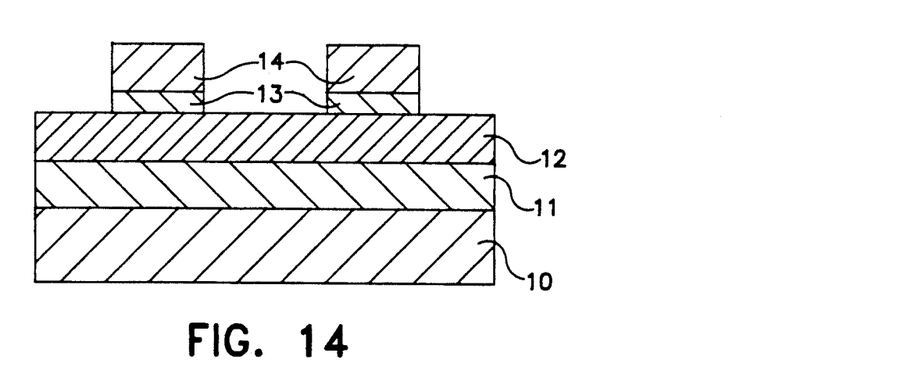
Figure 15:
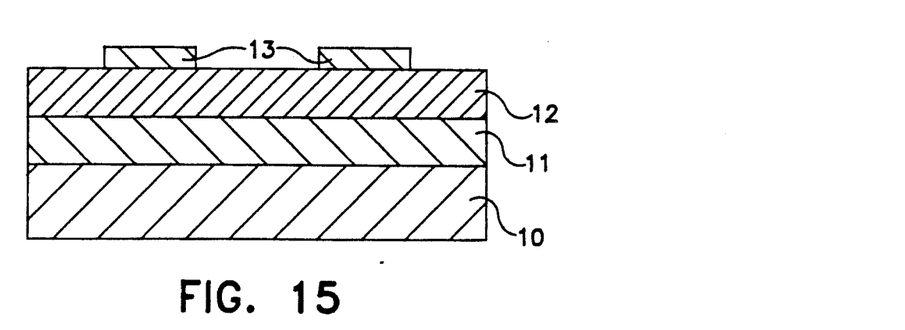

(1) Etching of TiN layer 13 in a fluorine-containing gas such as CHF3, using lower resist layer 14 as an etching mask. [FIG. 14]

(2) Removal of lower resist layer 14. [FIG. 14]

(3) Etching of AlSi layer 12 in a chlorine-containing gas such as BCl3, CCl4, using TiN layer 13 as an etching mask. A portion of the etching product is deposited on the side wall of TiN layer 13. [FIG. 16]

Figure 16:
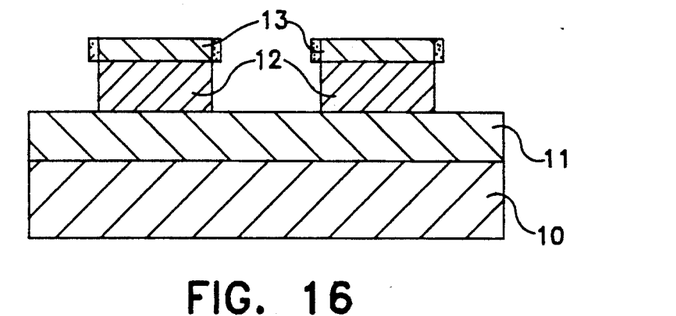

However, as long as TiN layer 13 is not removed, the side wall deposition does not form "rabbit ears". So the presence of the side wall deposition does not cause deterioration of the quality or coverage of the passivation layer thereon.

Figure 17:
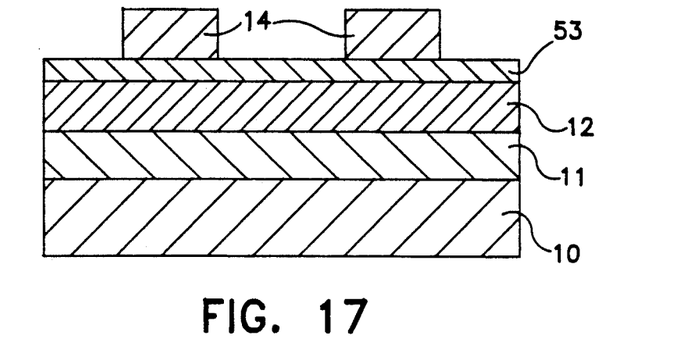

The cross-sectional views of FIG. 17-21 illustrate the process steps of the fifth embodiment of the present invention. The steps are as follows:

(1) The structure of FIG. 17 is achieved after process steps identical to the steps of FIGS. 1-6 except that tungsten (W) is used for the barrier layer 53 instead of TiN.

The W layer 53 (0.2 μm in thickness, for example) is deposited by sputtering. [FIG. 17]

Figure 18:
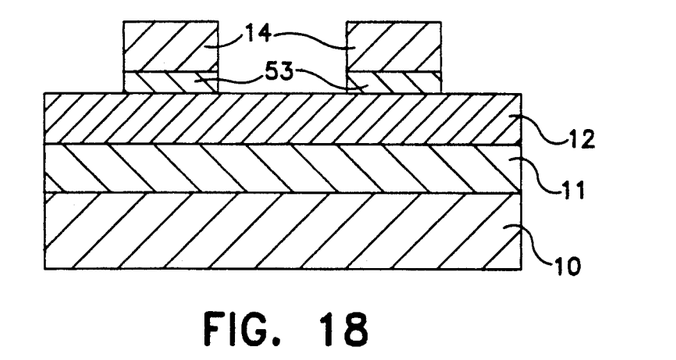
Figure 19:
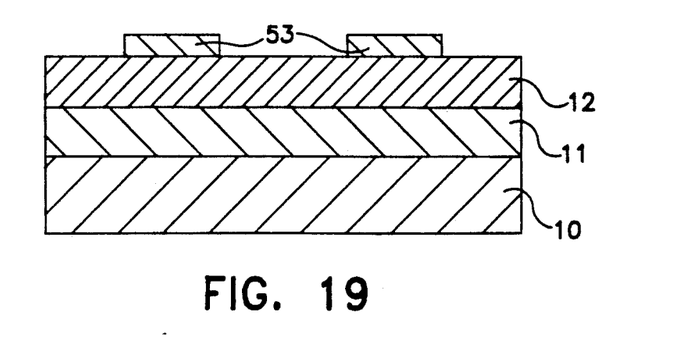

(2) Etching the W layer 53 using the lower resist layer of the predetermined pattern 14 as an etching mask. [FIG. 18]

(3) Removal of the lower resist layer 14. [FIG. 14]

Figure 20:
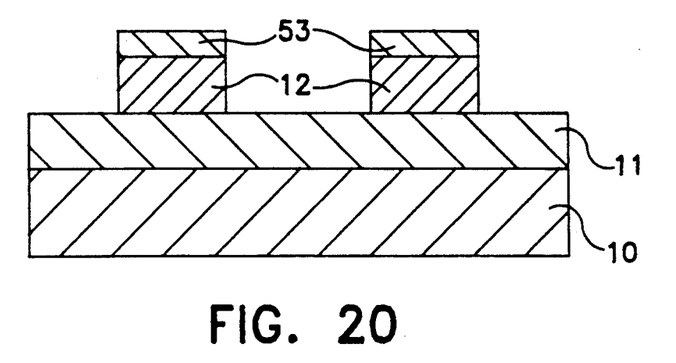

(4) Etching of the AlSi layer 12 using the patterned W layer as an etching mask. [FIG. 20] A mixture of chlorine-containing gas and fluorine-containing gas such as BCl3 and CF4, is suitable for this etching step. In this environment, the etching rate of W is higher than that of AlSi. So the side wall of the W layer 53 is slightly etched during the etching process. Therefore, no deposition of the etching product takes place on the side wall of W layer 53.

Figure 21:
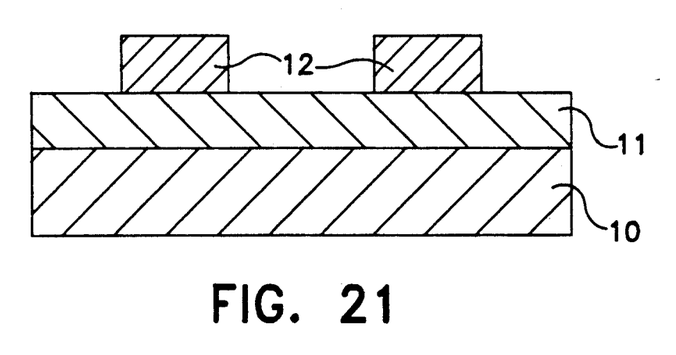

(5) Removal of the W layer 53. [FIG. 21]

Since the resultant AlSi pattern 12 has no "rabbit ears", a defect-free passivation layer can be deposited thereon with excellent coverage.

Alternatively, in this fifth embodiment, the step of removing the barrier layer 53 can be omitted because the presence of the patterned tungsten barrier layer 53 does not cause deterioration of the coverage of the passivation layer thereon.

As alternative materials for the barrier layer in the present invention, other refractory metals or refractory alloys such as titanium, tungsten, tungsten-silicon, and molybdenum silicon can also be used. SiO2, deposited by the decomposing TEOS (tetraethoxysilane) is another optional material for the barrier layer. In general, it is preferred for semiconductor devices that the barrier layer have a thickness of 0.1 to 0.2 μm.

Besides AlSi, pure aluminum or other aluminum alloys can also be patterned in accordance with the method of the present invention. For semiconductor devices, the thickness of the metal layer will be 0.3 to 1.5 μm.

Although a mask layer is formed by a three-layer resist process in the above-described embodiments, a single-layer resist process is acceptable as long as the desired resolution is achieved.

While this invention has been described with respect to specific embodiments, this invention may be embodied or practiced in still other ways without departing from the spirit or essential character thereof. The preferred embodiments described herein should therefore be considered illustrative only and not restrictive. The scope of the invention is indicated by the appended claims and all variations which come within the meaning of the claims are intended to be embraced therein.

What is claimed is:

1. A method for patterning a metallization layer comprising aluminum, said method comprising:
   depositing said metallization layer on an oxide covered silicon substrate;
   depositing a barrier layer on said metallization layer;
   forming a mask layer on selected portions of said barrier layer;
   a first etching step wherein said barrier layer and said metallization layer are etched, said first etching step also causing a thin film deposition of an etching product on sidewalls of said mask layer;
   a second etching step wherein said etched sidewall of said barrier layer is selectively further etched to the extent that this sidewall is separated from said thin film of said etching product on said sidewalls of said mask layer; and removing said mask layer.

2. A method for patterning a metallization layer comprising aluminum, said method comprising:

depositing said metallization layer on an oxide covered silicon substrate;

depositing a barrier layer on said metallization layer;

forming a mask layer on selected portions of said barrier layer;

a first etching step wherein said barrier layer and said metallization layer are etched, said first etching also causing a thin film deposition of an etching product on sidewalls of said mask layer;

removing said mask layer; and a second etching step wherein said etched sidewall of said barrier layer is selectively further etched to the extent that said thin film of said etching product is lifted off from said barrier layer.

* * * * *